(12) United States Patent  (10) Patent No.: US 10,330,751 B2
Gu et al.  (45) Date of Patent: Jun. 25, 2019

(54) DETERMINING POSITION OF RADIO FREQUENCY COIL IN MAGNETIC RESONANCE IMAGING SYSTEM (71) Applicant: SHENYANG NEUSOFT MEDICAL SYSTEMS CO., LTD., Shenyang (CN)

(72) Inventors: Huidong Gu, Shenyang (CN); Hongbing Hu, Shenyang (CN); Jianhua Shi, Shenyang (CN); Haobo Jin, Shenyang (CN); Hui Li, Shenyang (CN); Yunhan Li, Shenyang (CN)

(73) Assignee: Shenyang Neusoft Medical Systems Co., Ltd., Shenyang (CN)

( * ) Notice: Subject to any disclaimer, the term of this patent is extended or adjusted under 35 U.S.C. 154(b) by 209 days.

(21) Appl. No.: 15/282,921

(22) Filed: Sep. 30, 2016

(65) Prior Publication Data

US 2017/0184692 A1 Jun. 29, 2017

(30) Foreign Application Priority Data

Dec. 29, 2015 (CN) .......................... 2015 1 1017775

(51) Int. Cl.
*G01V 3/00* (2006.01)
*G01R 33/341* (2006.01)
(Continued)

(52) U.S. Cl.
CPC ......... *G01R 33/341* (2013.01); *G01R 33/307* (2013.01); *G01R 33/3664* (2013.01); *G01R 33/543* (2013.01); *G01R 33/3415* (2013.01)

(58) Field of Classification Search
CPC .................................................. G01R 33/543
(Continued)

(56) References Cited

U.S. PATENT DOCUMENTS 5,138,260 A 8/1992 Molyneaux et al.
5,374,889 A 12/1994 Leach et al.
(Continued)

FOREIGN PATENT DOCUMENTS

CN 1736329 A 2/2006
CN 102707249 A 7/2012
(Continued)

OTHER PUBLICATIONS

State Intellectual Property Office of the People's Republic of China, Office Action and Search Report Issued in Application No. 201511017775.0, dated Jan. 3, 2018, 23 pages. (Submitted with Partial Translation).

(Continued)

*Primary Examiner* — Louis M Arana
(74) *Attorney, Agent, or Firm* — McCoy Russell LLP (57) ABSTRACT A method for determining a position of an RF coil in a magnetic resonance imaging (MRI) system is disclosed. As an example, a center of a field of view (FOV) to be scanned may be adjusted to a magnetic field center of an MRI system, and coordinate values in a coordinate system for shape-characteristic points of the FOV may be determined, where an origin of the coordinate system is located at the magnetic field center of the MRI system. A preset gradient magnetic field may be applied to the FOV, and coil units respectively covering the shape-characteristic points may be determined. An effective region may be obtained by connecting the determined coil units according to the shape of the FOV, and a coil unit located in the effective region may be determined as an effective coil unit for imaging the FOV by the MRI system.

12 Claims, 4 Drawing Sheets (51) Int. Cl.
*G01R 33/30* (2006.01)
*G01R 33/36* (2006.01)
*G01R 33/54* (2006.01)
*G01R 33/3415* (2006.01)

(58) Field of Classification Search
USPC .................................. 324/318, 322, 314
See application file for complete search history.

(56) References Cited

U.S. PATENT DOCUMENTS

| | | | |
|---|---|---|---|
| 6,064,290 A | 5/2000 | Xu et al. | |
| 6,134,465 A | 10/2000 | Frederick et al. | |
| 6,724,923 B2 | 4/2004 | Ma et al. | |
| 6,850,064 B1 | 2/2005 | Srinivasan | |
| 7,352,182 B1 | 4/2008 | Steckner | |
| 2001/0009369 A1 | 7/2001 | Shimo et al. | |
| 2002/0181753 A1* | 12/2002 | Ma | G01R 33/3415 382/131 |
| 2003/0155917 A1 | 8/2003 | Young et al. | |
| 2003/0184292 A1* | 10/2003 | Meyer | G01R 33/3415 324/309 |
| 2008/0007263 A1 | 1/2008 | Machida et al. | |
| 2008/0211502 A1* | 9/2008 | Arnold | G01R 33/3415 324/318 |
| 2014/0155736 A1 | 6/2014 | Vaidya et al. | |
| 2014/0320128 A1 | 10/2014 | Paul et al. | |
| 2017/0059679 A1* | 3/2017 | Kondo | G01R 33/3664 |

FOREIGN PATENT DOCUMENTS

| | | |
|---|---|---|
| CN | 102961138 A | 3/2013 |
| CN | 104055517 A | 9/2014 |
| EP | 0177990 A1 | 4/1986 |
| JP | 2009106480 A | 5/2009 |
| WO | 2010045018 A1 | 4/2010 |

OTHER PUBLICATIONS

Muller, S. et al., "Why Less can be More: A Dynamic Coil Selection Algorithm for Real-Time Interactive MRI," Proceedings of the International Society for Magnetic Resonance in Medicine, 13th Scientific Meeting and Exhibition, Apr. 23, 2005, Miami Beach, Florida, 1 page.

European Patent Office, Extended European Search Report Issued in Application No. 16190969.2, dated Jul. 28, 2017, Germany, 12 pages.

* cited by examiner

DETERMINING POSITION OF RADIO FREQUENCY COIL IN MAGNETIC RESONANCE IMAGING SYSTEM

CROSS-REFERENCE TO RELATED APPLICATIONS

The present application claims priority to Chinese Patent Application No. 201511017775.0, filed on Dec. 29, 2015, the entire contents of which are hereby incorporated by reference for all purposes.

BACKGROUND

The present disclosure relates to how to determine a position of a radio frequency (RF) coil in a magnetic resonance imaging (MM) system.

In a magnetic resonance imaging (MRI) system, radio frequency (RF) energy may be used to excite hydrogen atoms in a body of a subject such as a patient, so that the hydrogen atoms may resonate, that is, the hydrogen atoms may enter into an excited state. Subsequently, the excited hydrogen atoms may return to their original state after the RF energy excitation is terminated. The process wherein hydrogen atoms in excited states return to their original states, may be called relaxation. An RF coil may be located around a scanned region of the subject, and signals related to the relaxation, such as time duration of the relaxation and the like, may be acquired according to the principles of nuclear magnetic resonance. Hereinafter, signals acquired by an RF coil may be referred to as relaxation signals, and the relaxation signals may be used to reconstruct an image of the scanned region. In nuclear magnetic resonance, the scanned region is generally referred to as a field of view (FOV).

In an MRI system, an RF coil may play a critical role in the overall performance of the system. For example, the RF coil may be composed of a plurality of coil units, and each of the coil units may have a relative small area. In order to improve the acquisition quality of relaxation signals and reduce undesirable noise, it may be required to determine, among the coil units, which are covering at least one part of the FOV and which are not covering the FOV. For example, a coil unit covering at least one part of the FOV may be named as an effective coil unit and may acquire a relaxation signal of a relative good intensity and quality. A coil unit not covering the FOV may be named as an ineffective coil unit and may acquire a relaxation signal of a relative poor intensity and quality. The ineffective coil unit may have negative effect on imaging, and may even cause signal interference to the acquisition of the effective coil unit. For example, during the process of an MRI operating, if only the coil units covering at least one part of the FOV (i.e. effective coil units) are activated and the coil units not covering the FOV (i.e. ineffective coil units) are deactivated, relaxation signals of a relative high intensity and quality may be acquired without undesirable signal interference and noise.

Effective coil units among the RF coil may be manually determined. For example, effective coil units may be determined by visual inspection according to an instruction of a laser-positioning light.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyzer. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer.

BRIEF DESCRIPTION OF DRAWINGS

Features of the present disclosure are illustrated by way of example and not limited in the following figures, in which like numerals indicate like elements, in which.

DETAILED DESCRIPTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures may have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Since a human body is mainly composed of water, muscles, fat, bones, etc., hydrogen atoms in a form of a variety of compounds exist in various human tissues. Therefore, in an MRI system, hydrogen atoms in a body of a subject may generate resonation by exciting them, then organs, tissues and the like in the scanned region of the subject may be imaged by acquiring relaxation signals released during the resonance process. In order to improve an MRI quality and image acquisition speed, an MRI system may be configured with a plurality of phased-array RF reception coils covering at least one part of the region to be imaged (i.e. FOV). For example, in an FOV, relaxation signals released from the hydrogen atoms in a body of a subject may be acquired by the RF coil.

Figure 1:
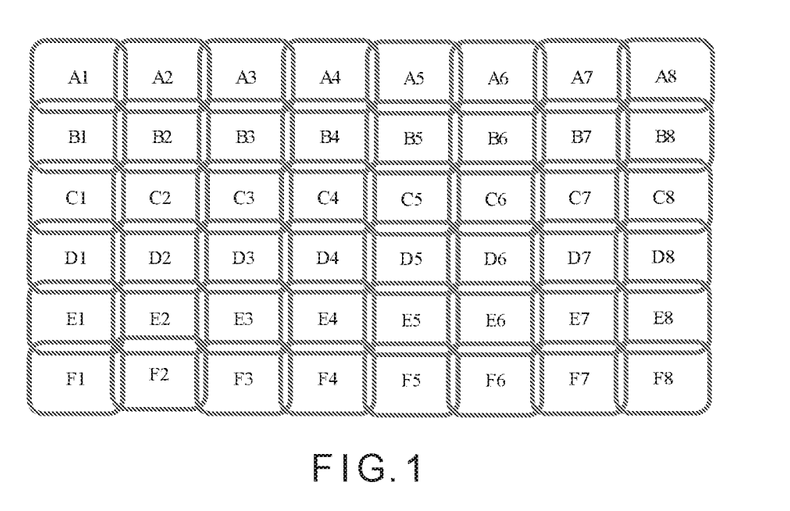
FIG. 1 schematically illustrates a structure of a radio frequency coil.

The structure of an RF coil is complex, and coil units which constitute the RF coil currently become smaller in volume and more in quantity. For example, as shown in FIG. 1, each of the reference numerals from A1 to F8 represents a coil unit. Improper selection of coil units in an RF coil may cause undesirable noise, thus reducing quality of imaging. During resonance imaging for an FOV of a subject, in order to improve accuracy and reduce interference, it may be desired to precisely determine effective coil units, for example, the coil units which cover the FOV.

Effective coil units among the RF coil may be manually determined. For example, effective coil units may be determined by visual inspection according to an instruction of a laser-positioning light. The method of manually determining effective coil units among the RF coil may have a relatively low efficiency and it may be too dependent on the operator's experience. In such an example, the accuracy volatility for determining effective coil units may be relatively large and the accuracy of an MRI imaging process may be greatly affected. Especially for a multi-channel RF coil with respect to a phased-array mode, it may be required to pre-set the operating mode of the coils and place a mark allowing determining a position, which may lead to relative low efficiency of determining a position, large volatile precision, and may greatly affect the operational procedures and actual scanned image effect.

Figure 2:
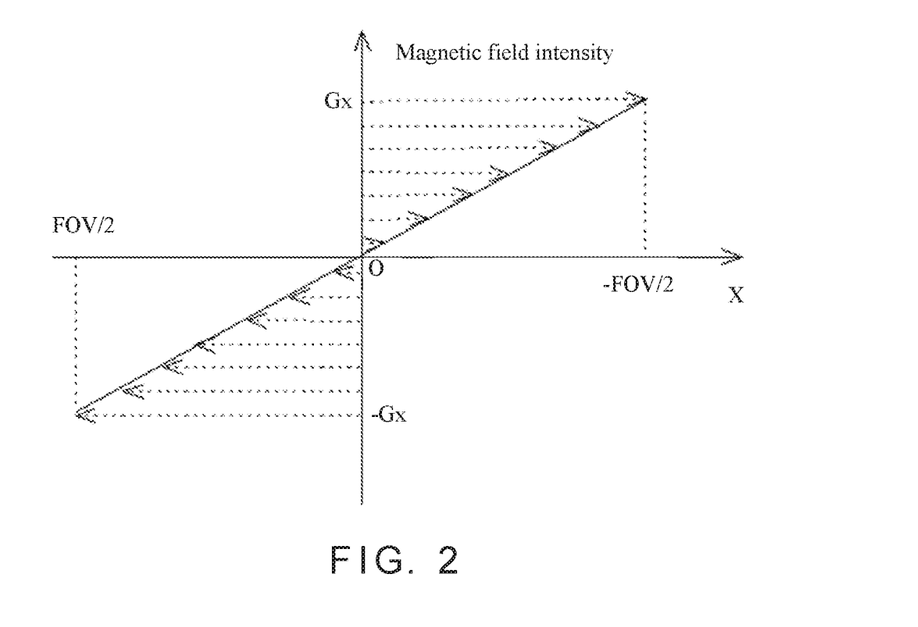
FIG. 2 illustrates a distribution of a gradient magnetic field along an x-axis direction according to an example of the present disclosure.

The magnetic field intensity in an MRI system may be usually fixed; however, there may be a linear relationship between the gradient magnetic field intensity and the distance to a magnetic field center of an MRI system. Herein, a gradient magnetic field may be generated by a gradient coil of the MRI system. As shown, FIG. 2 illustrates a distribution of a gradient magnetic field along an x-axis direction according to an example of the present disclosure. Herein, the x-axis may be a coordinate axis of a three-dimensional coordinate system mentioned hereinafter. The abscissa may be used to indicate the distance from a spatial point of an MRI system along the x-axis direction to the magnetic field center, while the ordinate may be used to indicate the gradient magnetic field intensity. As can be seen, in an MRI system, the farther the distance from a spatial point of the MRI system along the x-axis direction to the magnetic field center of the MRI system is, the stronger the gradient magnetic field intensity along the x-axis direction is. Herein, in FIG. 2, only the gradient magnetic field along the x-axis direction is illustrated, and since the gradient magnetic fields along other two axes are similar, detailed description is omitted for brevity.

Combined with such a characteristic for a gradient magnetic field intensity in an MRI system, a method for determining a position of an RF coil in an MRI system is provided according to an example of the present disclosure, comprising: adjusting a center of an FOV to be scanned to a magnetic field center of an MRI system based on an initial scanned image of a subject; determining coordinate values in a coordinate system for each of the shape-characteristic points of the FOV; applying a preset gradient magnetic field to the FOV; determining coil units respectively covering the shape-characteristic points according to a gyromagnetic ratio coefficient of hydrogen atom and a superimposed magnetic field intensity at each of the shape-characteristic points; obtaining an effective region by connecting the coil units respectively covering the shape-characteristic points according to the shape of the FOV; and determining coil units located in the effective region as effective coil units to be activated for imaging the FOV. Because there is a linear relationship between the gradient magnetic field intensity and the distance to the magnetic field center, in a preset gradient magnetic field, the gradient magnetic field intensity at each of the shape-characteristic points may be explicitly determined. Additionally, the gyromagnetic ratio coefficient of hydrogen atom is also a known value, so the coil units respectively covering the shape-characteristic points may be automatically determined, and thereby the effective coil units for imaging the FOV may be obtained, thus the artificial influence in manual determining a position may be eliminated, and the efficiency may be effectively improved.

Before description of the method for determining a position of an RF coil in an MRI system according to an example of the present disclosure, a three-dimensional coordinate system created in this disclosure may be firstly explained.

The origin of the coordinate system may be located at the magnetic field center in the MRI system, and under normal circumstances, the directions of coordinate values may be not limited. However, in order to facilitate the calculation, according to an example of the disclosure, the z-axis and x-axis of the coordinate system may be located in a horizontal plane with respect to the MRI system, the z-axis may be an axial direction of the MRI system, and the y-axis may be perpendicular to the horizontal plane, where the positive direction of the z-axis may be not limited.

Figure 3:
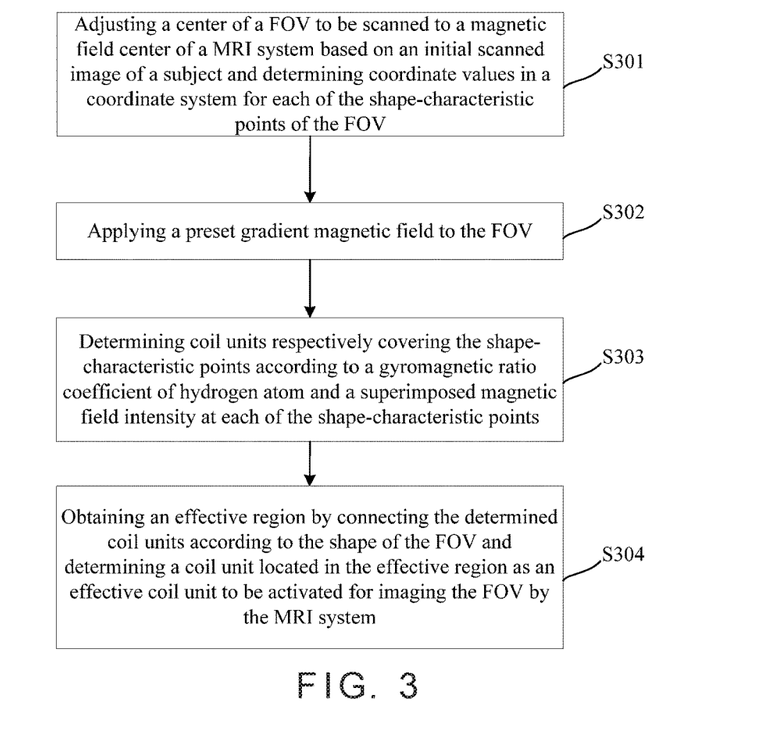
FIG. 3 is a flowchart illustrating a method for determining a position of an RF coil in an MRI system according to an example of the present disclosure.

FIG. 3 is a flowchart illustrating a method for determining a position of an RF coil in an MRI system according to an example of the present disclosure, and the method may include blocks S301-S304 below.

At block S301, a center of an FOV to be scanned may be adjusted to a magnetic field center of an MRI system based on an initial scanned image of a subject, and then coordinate values in a coordinate system for each of the shape-characteristic points of the FOV may be determined, wherein the shape-characteristic points indicate a shape of the FOV, and an RF coil may include a plurality of coil units.

Due to the organs and structure of a subject typically having an irregular geometry, it may be necessary for an operator to determine a position approximately based on his experience and examination requirements in a clinical scan. For example, it may be possible to firstly use the MRI system with a faster scanning speed to obtain a lower resolution image, which may be referred to as an initial scanned image in the following. Based on the initial scanned image, it may be able to approximately determine the portion to be scanned; the shape and size of the FOV may also be determined according to a space range, an inclination angle and so on to be scanned which may be defined by the anatomy of the portion to be scanned. However, based on the initial scanned image, it may be unable to determine the position information of an RF coil in the coordinate system.

For example, if the kidney of a subject is to be imaged, the RF coil may be placed approximately on the abdomen of the subject based on human anatomy. Then, a low resolution pre-scanning may be performed by an MRI system to obtain an initial scanned image which may substantially represent a basic internal structure of the subject, and to determine the approximate size and shape of the FOV according to the position of kidney on the initial scanned image.

Based on the above, before using a high resolution scanning parameter, the actual target to be scanned may be known for this initial scan, such as an organ, a tissue portion and so on. Therefore, the shape and size of an FOV may be determined in advance. The FOV may be usually in a rectangular shape, and also may be in a polygonal or circular geometry. The shape-characteristic points are mainly used to indicate the shape of an FOV, for example, if an FOV is in a rectangular shape, the shape-characteristic points of the FOV may be the four vertices of the rectangle, and for another example, if an FOV is in a triangle shape, the shape-characteristic points of the FOV may be the three vertices of the triangle.

The position of an FOV in the coordinate system may be determined based on the initial scanned image, and the center of an FOV may be adjusted to the origin of the coordinate system by moving the scanning body (e.g., a patient). In this way, the characteristic that the gradient magnetic field intensity corresponds to the distance may be utilized more accurately. After adjustment, the center of the FOV may be located at the magnetic field center of the MRI system, which may thereby achieve the best imaging precision and effect.

At block S302, a preset gradient magnetic field may be applied to the FOV.

For example, the gradient magnetic field may be generated by a gradient coil of the MRI system. By pre-setting, the specific value for the applied gradient magnetic field intensity may be determined.

Applying a preset gradient magnetic field to an FOV may also be understood as applying a gradient magnetic field in the MRI system.

It should be noted that, after applying a gradient magnetic field, the MRI system will have both the magnetic field of the MRI system and the gradient magnetic field, thereby forming a superimposed magnetic field.

At block S303, coil units respectively covering the shape-characteristic points may be determined according to a gyromagnetic ratio coefficient of hydrogen atom and a superimposed magnetic field intensity at each of the shape-characteristic points.

For example, the coordinate values of each of the shape-characteristic points may be determined by pre-scanning. Since the origin of the coordinate system is consistent with the magnetic field center of the MRI system, for a shape-characteristic point, its x-axis coordinate value may be the distance from this shape-characteristic point along the x-axis direction to the magnetic field center of the MRI system, and its y-axis coordinate value may be the distance from this shape-characteristic point along the y-axis direction to the magnetic field center of the MRI system, and its z-axis coordinate value may be the distance from this shape-characteristic point along the z-axis direction to the magnetic field center of the MRI system. Thus, the gradient magnetic field intensity at this shape-characteristic point along each of the coordinate axes may be explicitly determined in the preset gradient magnetic field.

According to an example, with the magnetic field intensity of the MRI system, the coordinate values of each of the target shape-characteristic points and a gradient magnetic field intensity coefficient in each of coordinate axis directions for each of the target shape-characteristic points, the superimposed magnetic field intensity may be calculated specifically according to the following formula:

$$B(x,y,z)=B0+xGx+yGy+zGz.$$

Wherein, x, y, z are the coordinate value of a shape-characteristic point from each axis, respectively; $B(x, y, z)$ is the superimposed magnetic field intensity of the shape-characteristic point; $B0$ is the magnetic field intensity for the magnetic field of the MRI system; $Gx$ is the gradient magnetic field intensity coefficient of the shape-characteristic point along the x-axis direction; $Gy$ is the gradient magnetic field intensity coefficient of the shape-characteristic point along the y-axis direction; $Gz$ is the gradient magnetic field intensity coefficient of the shape-characteristic point along the z-axis direction.

Figure 4:
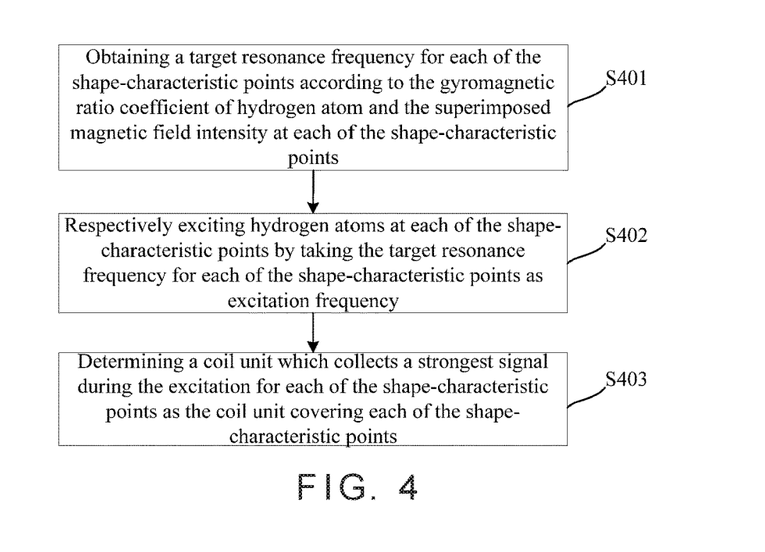
FIG. 4 is a flowchart illustrating a method for determining coil units respectively covering a plurality of shape-characteristic points according to an example of the present disclosure.

A method for determining a position of coil units respectively covering the shape-characteristic points is provided in an example of the present disclosure. For the example illustrated in FIG. 3, FIG. 4 illustrates a flowchart of a method for determining coil units respectively covering a plurality of shape-characteristic points according to another example of the present disclosure. As shown in FIG. 4, the method may include the blocks S401-S403 below.

At block S401, a target resonance frequency for each of the shape-characteristic points may be obtained according to the gyromagnetic ratio coefficient of hydrogen atom and the superimposed magnetic field intensity at each of the shape-characteristic points.

For example, for the plurality of shape-characteristic points, the resonance frequency corresponding to each of the shape-characteristic points may be respectively obtained by calculation successively.

According to an example, the resonance frequency for each of the shape-characteristic points may be obtained with the following formula:

$$\omega=\gamma \times B(x,y,z).$$

Wherein, $\omega$ represents the resonance frequency of a shape-characteristic point; $\gamma$ represents the gyromagnetic ratio coefficient of hydrogen atom; $B(x, y, z)$ represents the superimposed magnetic field intensity at the shape-characteristic point.

At block S402, hydrogen atoms at each of the shape-characteristic points may be excited by taking the target resonance frequency as an excitation frequency.

At block S403, a coil unit which acquires a strongest signal during excitation for each of the shape-characteristic points may be determined as the target coil unit covering each of the shape-characteristic points.

For example, the target resonance frequency may be the resonance frequency of the hydrogen atoms at each of the shape-characteristic points. In the MRI system, hydrogen atoms in a body of a subject may be excited by using excitation frequency, which may utilize a narrow-band or single-frequency-point mode. When the resonance frequency of a hydrogen atom in the excitation region is the same as the excitation frequency, the hydrogen atom may generate resonance under the excitation, and the region of the hydrogen atom may generate a relatively strong nuclear magnetic relaxation signal. With the excitation frequency farther away from the region, the intensity of the relaxation signal may be dramatically decreased.

For example, since the excitation frequency is the same as the resonance frequency (i.e., the target resonance frequency) of the hydrogen atoms at each of the shape-characteristic points, in a case the hydrogen atoms at each of the shape-characteristic points may be excited, the hydrogen atoms at each of the shape-characteristic points may generate a nuclear magnetic relaxation signal under the excitation, and coil units covering the shape-characteristic points may acquire relatively strong signals, whereas the intensity of signals acquired from near or farther coil units may be decreased significantly. Therefore, by comparing the intensity of signals acquired from each of the coil units during the excitation, the target coil units may be explicitly determined.

At block S304, an effective region may be obtained by connecting the coil units respectively covering the shape-characteristic points according to the shape of the FOV; and a coil unit located in the effective region may be determined as an effective coil unit to be activated for imaging the FOV by the MRI system.

Figure 5:
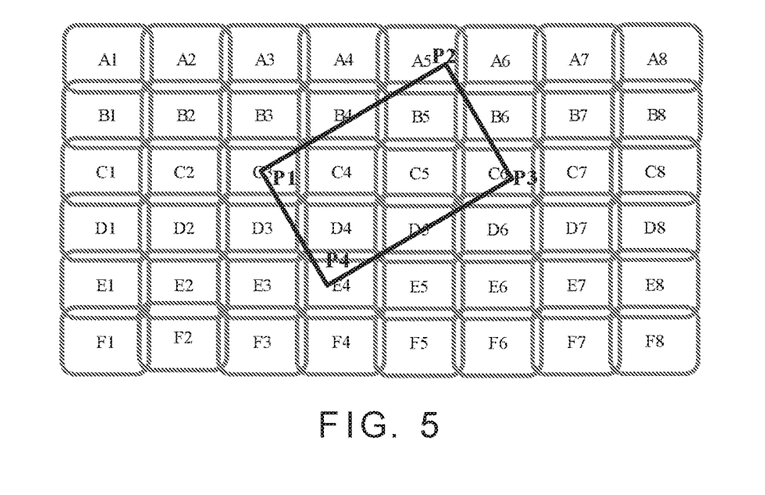
FIG. 5 schematically illustrates the effect for determining a position of an RF coil in an MRI system according to an example of the present disclosure.

For example, at the block S303, the coil units respectively covering the shape-characteristic points may be determined. For example, as shown in FIG. 5, FIG. 5 schematically illustrates the effect for determining a position of an RF coil in an MRI system according to an example of the present disclosure. In FIG. 5, the RF coil may include forty-eight coil units from A1 to F8. The FOV to be scanned and imaged may be in a rectangular shape with four shape-characteristic points. Four shape-characteristic points are P1, P2, P3 and P4, respectively. Through the procedure of blocks S301 to S303, the coil units respectively covering the four shape-characteristic points may be determined. As shown in FIG. 5, the coil unit C3 covers the shape-characteristic point P1, the coil unit A5 covers the shape-characteristic point P2, the coil unit C6 covers the shape-characteristic point P3, and the coil unit E4 covers the shape-characteristic point P4. Then, a rectangular effective region may be obtained by connecting the four shape-characteristic points according to the shape of the FOV, such as the rectangular region enclosed by the four shape-characteristic points P1, P2, P3 and P4 in FIG. 5. This effective region may include a combination of coil units which are composed of coil units A5, B4, B5, B6, C3, C4, C5, C6, D3, D4, D5 and E4, and the combination of coil units may be the best combination of coil units for scanning and imaging at such a time.

As can be seen from the above examples, a center of an FOV to be scanned may be adjusted to a magnetic field center of an MRI system based on an initial scanned image of a subject, and then the coordinate values in a coordinate system for each of the shape-characteristic points of the FOV may be determined. Next, a preset gradient magnetic field may be applied to the FOV, and then coil units respectively covering the shape-characteristic points may be determined according to a gyromagnetic ratio coefficient of hydrogen atom and a superimposed magnetic field intensity at each of the shape-characteristic points. Then, an effective region may be obtained by connecting the determined coil units according to the shape of the FOV, and a coil unit located in the effective region may be determined as an effective coil unit to be activated for imaging the FOV by the MRI system. Because there is a linear relationship between the gradient magnetic field intensity and the distance to the magnetic field center, the gradient magnetic field intensity at each of the shape-characteristic points may explicitly determined under the preset gradient magnetic field. Additionally, the gyromagnetic ratio coefficient of a hydrogen atom is also a known value, therefore, the coil units respectively covering the shape-characteristic points may be automatically determined, and thereby the effective coil units for imaging the FOV may be obtained, thus the artificial influence in manual determining a position may be eliminated, and the efficiency may be effectively improved.

Figure 6:
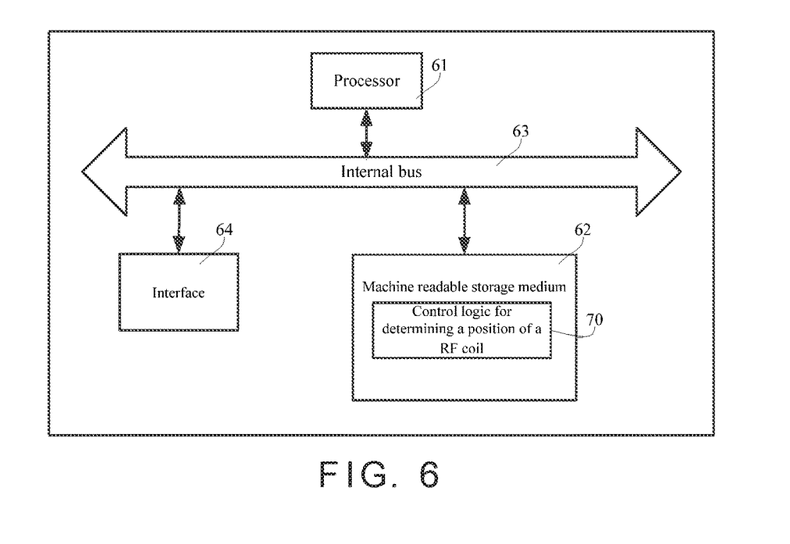
FIG. 6 illustrates a hardware architecture of a device for determining a position of an RF coil in an MRI system according to an example of the present disclosure.

For the above-described method, a device for determining a position of an RF coil in an MRI system is also provided in the present disclosure. As shown in FIG. 6, the device for determining a position of an RF coil may include a processor 61 and a machine readable storage medium 62, wherein the processor 61 and the machine readable storage medium 62 may be connected to each other through an internal bus 63. In other possible implementations, the device for determining a position of an RF coil may further include an external interface 64, in order to communicate with other devices or components.

In different examples, the machine readable storage medium 62 may be: RAM (Random Access Memory), volatile memory, non-volatile memory, flash memory, storage drives (such as hard drives), solid state drives, any type of storage disks (such as, CD-ROM, DVD, etc.), or similar storage medium, or a combination thereof.

Figure 7:
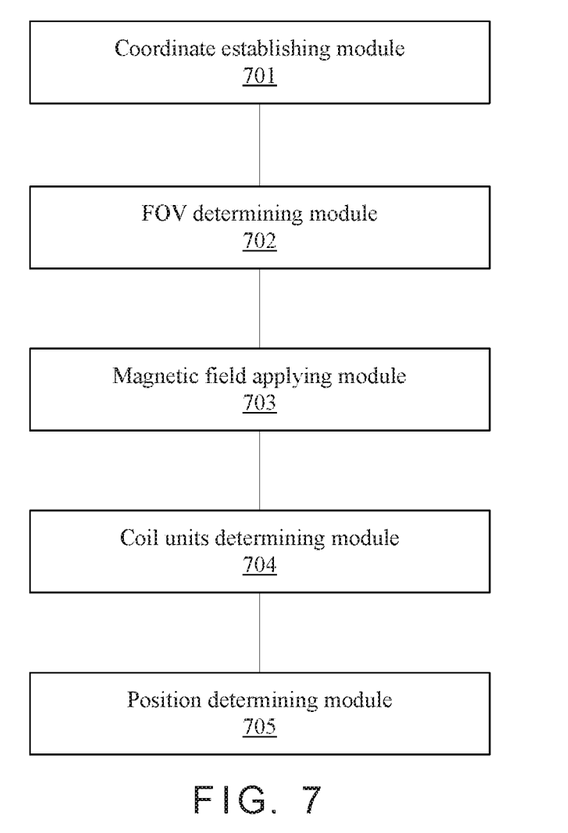
FIG. 7 illustrates functional blocks of a control logic for determining a position of an RF coil in an MRI system according to an example of the present disclosure.

Further, the machine readable storage medium 62 may store a control logic 70 for determining a position of an RF coil in the MRI system. Divided by the functions, as shown in FIG. 7, the control logic 70 may include a coordinate establishing module 701, an FOV determining module 702, a magnetic field applying module 703, a coil units determining module 704, and a position determining module 705.

The coordinate establishing module 701 may be used to establish a coordinate system, wherein the origin of the coordinate system is located at the magnetic field center of the MRI system.

The FOV determining module 702 may be used to adjust a center of an FOV to be scanned to a magnetic field center of an MRI system based on an initial scanned image of a subject, and determine coordinate values in a coordinate system for each of the shape-characteristic points of the FOV, wherein the shape-characteristic points indicate the shape of the FOV; an RF coil may cover the FOV and include a plurality of coil units.

The magnetic field applying module 703 may be used to apply a preset gradient magnetic field to the FOV.

The coil units determining module 704 may be used to determine coil units respectively covering the shape-characteristic points according to a gyromagnetic ratio coefficient of hydrogen atom and a superimposed magnetic field intensity at each of the shape-characteristic points.

The position determining module 705 may be used to obtain an effective region by connecting the determined coil units according to the shape of the FOV, and determine a coil unit located in the effective region as an effective coil unit to be activated for imaging the FOV by the MRI system.

According to an example, the coil units determining module 704 may include a calculation sub-module, an excitation sub-module, and a determination sub-module.

The calculation sub-module may be used to obtain a target resonance frequency for each of the shape-characteristic points according to the gyromagnetic ratio coefficient of hydrogen atom and the superimposed magnetic field intensity at each of the shape-characteristic points, wherein each of the shape-characteristic points may be any one of the plurality of shape-characteristic points.

The excitation sub-module may be used to excite the hydrogen atoms at each of the shape-characteristic points by taking the target resonance frequency for each of the shape-characteristic points as excitation frequency during the excitation process.

The determination sub-module may be used to determine a coil unit which acquires a strongest signal during the excitation for each of the shape-characteristic points as the coil unit covering each of the shape-characteristic points.

According to an example, a superimposed magnetic field intensity at each of the shape-characteristic points may be obtained based on the magnetic field intensity for the MRI system, the coordinate values of each of the shape-characteristic points and a gradient magnetic field intensity coefficient in each of coordinate axis directions for each of the shape-characteristic points.

According to an example, based on gyromagnetic ratio coefficient of hydrogen atom and the superimposed magnetic field intensity at each of the shape-characteristic points, the target resonance frequency for each of the shape-characteristic points may be obtained with the following formula:

$$\omega = \gamma \times B(x,y,z)$$

Wherein, $\omega$ represents the target resonance frequency of a shape-characteristic point; $\gamma$ represents a gyromagnetic ratio coefficient of hydrogen atom; $B(x, y, z)$ represents the superimposed magnetic field intensity at the shape-characteristic point.

According to an example, the z-axis and x-axis of the coordinate system may be located in a horizontal plane with respect to the MRI system, wherein the z-axis is an axial direction of the MRI system, and the y-axis is perpendicular to the horizontal plane.

The example below may be implemented with software, which describes how the device for determining a position of an RF coil in the MRI system runs the control logic 70. In this example, the control logic 70 of the present disclosure should be understood as machine readable instructions stored in the machine readable storage medium 62. When the processor 61 of the device for determining a position of an RF coil in an MRI system executes the control logic 70, the processor 61 executes corresponding machine readable instructions of the control logic 70 stored in the machine readable storage medium 62 to:

adjust a center of an FOV to be scanned to a magnetic field center of an MRI system based on an initial scanned image of a subject, wherein the origin of the coordinate system is located at the magnetic field center of the MRI system, and an RF coil of the MRI system includes a plurality of coil units;

determine coordinate values in a coordinate system for each of the shape-characteristic points of the FOV, wherein the shape-characteristic points indicate the shape of the FOV;

apply a preset gradient magnetic field to the FOV;

determine coil units respectively covering the shape-characteristic points according to a gyromagnetic ratio coefficient of hydrogen atom and a superimposed magnetic field intensity at each of the shape-characteristic points;

obtain an effective region by connecting the determined coil units according to the shape of the FOV; and determine a coil unit located in the effective region as an effective coil unit to be activated for imaging the FOV by the MRI system.

According to an example, when determining coil units respectively covering the shape-characteristic points according to the gyromagnetic ratio coefficient of hydrogen atom and the superimposed magnetic field intensity at each of the shape-characteristic points, the machine readable instructions stored in the machine-readable storage medium 62 further cause the processor 61 to:

obtain a target resonance frequency for each of the shape-characteristic points according to a gyromagnetic ratio coefficient of hydrogen atom and the superimposed magnetic field intensity at each of the shape-characteristic points;

respectively excite hydrogen atoms at each of the shape-characteristic points by taking the target resonance frequency for each of the shape-characteristic points as excitation frequency; and determine a coil unit which acquires a strongest signal during the excitation for each of the shape-characteristic points as the coil units covering each of the shape-characteristic points.

Further, when obtaining a target resonance frequency for each of the shape-characteristic points according to the gyromagnetic ratio coefficient of hydrogen atom and the superimposed magnetic field intensity at each of the shape-characteristic points, the machine readable instructions stored in the machine readable storage medium 62 may cause the processor 61 to calculate a target resonance frequency for each of the shape-characteristic points with the following formula:

$$\omega = \gamma B(x,y,z)$$

Wherein, $\omega$ is the target resonance frequency of a shape-characteristic point; $\gamma$ is the gyromagnetic ratio coefficient of hydrogen atom; and $B(x, y, z)$ is the superimposed magnetic field intensity at the shape-characteristic point.

According to an example, after applying a preset gradient magnetic field to the FOV, the machine readable instructions stored in the machine readable storage medium 62 may further cause the processor 61 to calculate superimposed magnetic field intensity at each of the shape-characteristic points with the magnetic field intensity of the MRI system, the coordinate values of each of the shape-characteristic points and a gradient magnetic field intensity coefficient in each of coordinate axis directions for each of the shape-characteristic points.

According to an example, the z-axis and x-axis of the coordinate system are located in a horizontal plane with respect to the MRI system, the z-axis is the axial direction of the MRI system, and the y-axis is perpendicular to the horizontal plane.

The above are only preferred examples of the present disclosure is not intended to limit the disclosure within the spirit and principles of the present disclosure. Any changes made, equivalent replacement, or improvement in the protection of the present disclosure should contain within the range of the present disclosure.

The methods, processes and units described herein may be implemented by hardware (including hardware logic circuitry), software or firmware or a combination thereof. The term 'processor' is to be interpreted broadly to include a processing unit, ASIC, logic unit, or programmable gate array etc. The processes, methods and functional units may all be performed by the one or more processors; reference in this disclosure or the claims to a 'processor' should thus be interpreted to mean 'one or more processors'.

Further, the processes, methods and functional units described in this disclosure may be implemented in the form of a computer software product. The computer software product is stored in a storage medium and comprises a plurality of instructions for making a processor to implement the methods recited in the examples of the present disclosure.

The figures are only illustrations of an example, wherein the units or procedure shown in the figures are not necessarily essential for implementing the present disclosure. Those skilled in the art will understand that the units in the device in the example can be arranged in the device in the examples as described, or can be alternatively located in one or more devices different from that in the examples. The units in the examples described can be combined into one module or further divided into a plurality of sub-units.

Although the flowcharts described show a specific order of execution, the order of execution may differ from that which is depicted. For example, the order of execution of two or more blocks may be changed relative to the order shown. Also, two or more blocks shown in succession may be executed concurrently or with partial concurrence. All such variations are within the scope of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Throughout the present disclosure, the word "comprise", or variations such as "comprises" or "comprising", will be understood to imply the inclusion of a stated element, integer or step, or group of elements, integers or steps, but not the exclusion of any other element, integer or step, or group of elements, integers or steps.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A method of determining a RF coil for imaging a field of view (FOV) in a magnetic resonance imaging (MRI) system, comprising:
adjusting a center of the FOV to be scanned to a center of a magnetic field in the MRI system based on an initial scanned image of a subject by moving the subject, wherein the RF coil of the MRI system includes a plurality of coil units;
determining coordinate values in a coordinate system for shape-characteristic points of the FOV based on the initial scanned image, wherein an origin of the coordinate system is located at the center of the magnetic field in the MRI system, and the shape-characteristic points indicate a shape of the FOV;
superimposing a preset gradient magnetic field on the magnetic field to the FOV;
determining coil units respectively covering the shape-characteristic points according to a gyromagnetic ratio coefficient of hydrogen atom and a superimposed magnetic field intensity at each of the shape-characteristic points, wherein the superimposed magnetic field intensity is an intensity of the magnetic field and the gradient magnetic field superimposed together;
obtaining an effective region by connecting the determined coil units according to the shape of the FOV; and
determining the coil units located in the effective region as effective coil units to be activated for imaging the FOV by the MRI system.

2. The method of claim 1 further comprises:
obtaining the superimposed magnetic field intensity at each of the shape-characteristic points with the magnetic field intensity of the MRI system, the coordinate values of each of the shape-characteristic points and a gradient magnetic field intensity coefficient in each coordinate axis direction for each of the shape-characteristic points, after applying the preset gradient magnetic field to the FOV.

3. The method of claim 1, wherein determining coil units respectively covering the shape-characteristic points according to the gyromagnetic ratio coefficient of hydrogen atom and the superimposed magnetic field intensity at each of the shape-characteristic points comprises:
obtaining a target resonance frequency for each of the shape-characteristic points according to the gyromagnetic ratio coefficient of hydrogen atom and the superimposed magnetic field intensity at each of the shape-characteristic points;
respectively exciting hydrogen atoms at each of the shape-characteristic points by taking the target resonance frequency for each of the shape-characteristic points as excitation frequency; and
determining a coil unit which acquires a strongest signal during the excitation for each of the shape-characteristic points as the coil unit covering each of the shape-characteristic points.

4. The method of claim 3, wherein obtaining the target resonance frequency for each of the shape-characteristic points according to the gyromagnetic ratio coefficient of hydrogen atom and the superimposed magnetic field intensity at each of the shape-characteristic points comprises:
obtaining the target resonance frequency for each of the shape-characteristic points with the following formula:

$$\omega = \gamma \times B(x,y,z);$$

wherein, $\omega$ is the target resonance frequency of each shape-characteristic point;
$\gamma$ is the gyromagnetic ratio coefficient of hydrogen atom; and
$B(x, y, z)$ is the superimposed magnetic field intensity at each shape-characteristic point.

5. The method of claim 1, wherein
a z-axis and an x-axis of the coordinate system are located in a horizontal plane with respect to the MRI system;
the z-axis is an axial direction of the MRI system; and
the y-axis is perpendicular to the horizontal plane.

6. The method of claim 1 further comprises:
performing a pre-scanning of a lower resolution to obtain the initial scanned image including a region to be scanned of the subject.

7. A device for determining an RF coil for imaging a field of view (FOV) in an MRI system, comprising:
a processor which invokes machine readable instructions corresponding to a control logic for determining a position of the RF coil stored on a storage medium and executes the machine readable instructions to:
adjust a center of the FOV to be scanned to a center of a magnetic field in the MRI system based on an initial scanned image of a subject by moving the subject, wherein the RF coil of the MRI system includes a plurality of coil units;
determine coordinate values in a coordinate system for each of shape-characteristic points of the FOV, wherein an origin of the coordinate system is located at the center of the magnetic field in the MRI system, and the shape-characteristic points indicate a shape of the FOV;
superimpose a preset gradient magnetic field on the magnetic field to the FOV;
determine coil units respectively covering the shape-characteristic points according to a gyromagnetic ratio coefficient of hydrogen atom and a superimposed magnetic field intensity at each of the shape-characteristic points, wherein the superimposed magnetic field intensity is an intensity of the magnetic field and the gradient magnetic field superimposed together;

obtain an effective region by connecting the determined coil units according to the shape of the FOV; and determine coil units located in the effective region as effective coil units to be activated for imaging the FOV by the MRI system.

8. The device according to claim 7, wherein said machine readable instructions further cause the processor to:

obtain a superimposed magnetic field intensity at each of the shape-characteristic points with the magnetic field intensity of the MRI system, the coordinate values of each of the shape-characteristic points and a gradient magnetic field intensity coefficient in coordinate axis direction for each of the shape-characteristic points, after applying the preset gradient magnetic field to the FOV.

9. The device according to claim 7, wherein, when determining coil units respectively covering the shape-characteristic points according to the gyromagnetic ratio coefficient of hydrogen atom and the superimposed magnetic field intensity at each of the shape-characteristic points, said machine readable instructions cause the processor to:

obtain a target resonance frequency for each of the shape-characteristic points according to the gyromagnetic ratio coefficient of hydrogen atom and the superimposed magnetic field intensity at each of the shape-characteristic points;

respectively excite hydrogen atoms at each of the shape-characteristic points by taking the target resonance frequency for each of the shape-characteristic points as excitation frequency; and determine a coil unit which acquires a strongest signal during the excitation for each of the shape-characteristic points as the coil unit covering each of the shape-characteristic points.

10. The device according to claim 9, wherein, when obtaining the target resonance frequency for each of the shape-characteristic points according to the gyromagnetic ratio coefficient of hydrogen atom and the superimposed magnetic field intensity at each of the shape-characteristic points, said machine readable instructions cause the processor to:

obtain the target resonance frequency for each of the shape-characteristic points with the following formula:

$$\omega = \gamma \times B(x,y,z);$$

wherein, $\omega$ is the target resonance frequency of each shape-characteristic point;

$\gamma$ is the gyromagnetic ratio coefficient of hydrogen atom; and

B (x, y, z) is the superimposed magnetic field intensity at each shape-characteristic point.

11. The device according to claim 7, wherein a z-axis and an x-axis of the coordinate system are located in a horizontal plane with respect to the MRI system;

the z-axis is an axial direction of the MRI system; and the y-axis is perpendicular to the horizontal plane.

12. The device according to claim 7, wherein said machine readable instructions further cause the processor to:

perform a pre-scanning of a lower resolution to obtain the initial scanned image including a region to be scanned of the subject.

* * * * *